United States Patent
Okumura

(10) Patent No.: US 7,883,955 B2
(45) Date of Patent: Feb. 8, 2011

(54) GATE DIELECTRIC/ISOLATION STRUCTURE FORMATION IN HIGH/LOW VOLTAGE REGIONS OF SEMICONDUCTOR DEVICE

(75) Inventor: Yoichi Okumura, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/755,320

(22) Filed: Apr. 6, 2010

(65) Prior Publication Data

US 2010/0197091 A1 Aug. 5, 2010

Related U.S. Application Data

(62) Division of application No. 11/266,988, filed on Nov. 4, 2005, now abandoned.

(30) Foreign Application Priority Data

Nov. 5, 2004 (JP) .............................. 2004-322774

(51) Int. Cl.
*H01L 21/8238* (2006.01)

(52) U.S. Cl. .............................. 438/218; 257/E21.545; 257/E21.632

(58) Field of Classification Search ................. 438/218, 438/400; 257/E21.545, E21.632
See application file for complete search history.

(56) References Cited

U.S. PATENT DOCUMENTS

| | | |
|---|---|---|
| 4,442,448 A | 4/1984 | Shimbo |
| 5,181,090 A | 1/1993 | Maruo |
| 5,191,401 A | 3/1993 | Shirai et al. |
| 5,332,913 A | 7/1994 | Shappir |
| 6,313,508 B1 | 11/2001 | Kobayashi |
| 6,894,350 B2 | 5/2005 | Shimizu et al. |
| 2002/0130314 A1 | 9/2002 | Yim et al. |
| 2003/0080354 A1* | 5/2003 | Kanda et al. ................. 257/200 |
| 2005/0003618 A1* | 1/2005 | Kanda ........................ 438/275 |
| 2005/0130365 A1* | 6/2005 | Noda et al. ................. 438/216 |
| 2005/0170575 A1* | 8/2005 | Lee et al. ..................... 438/197 |
| 2006/0003511 A1* | 1/2006 | Hebert et al. ............... 438/199 |
| 2007/0004146 A1* | 1/2007 | Prinz et al. .................. 438/261 |
| 2007/0262382 A1* | 11/2007 | Ishii et al. ................... 257/350 |

* cited by examiner

*Primary Examiner*—Wael M Fahmy
*Assistant Examiner*—Sarah K Salerno
(74) *Attorney, Agent, or Firm*—Warren L. Franz; Wade J. Brady, III; Frederick J. Telecky, Jr.

(57) ABSTRACT

A semiconductor device has a thicker gate dielectric layer (gate-insulation film 16 of, e.g., 40 nm) for a high voltage PMOS transistor (Tr1) that is formed simultaneously in a first thermal oxidation process together with the formation of LOCOS isolation structures (3) for element seaaration of low voltage PMOS and NMOS transistors (Tr3, Tr4), and has a thinner gate dielectric layer (gate-insulation film 25 of, e.g., 7 nm) for a high voltage NMOS transistor (Tr2) that is formed simultaneously in a second thermal oxidation process together with the formation of gate dielectric layers (gate-insulation films 33, 42) of low voltage PMOS and NMOS transistors (Tr3, Tr4).

16 Claims, 9 Drawing Sheets

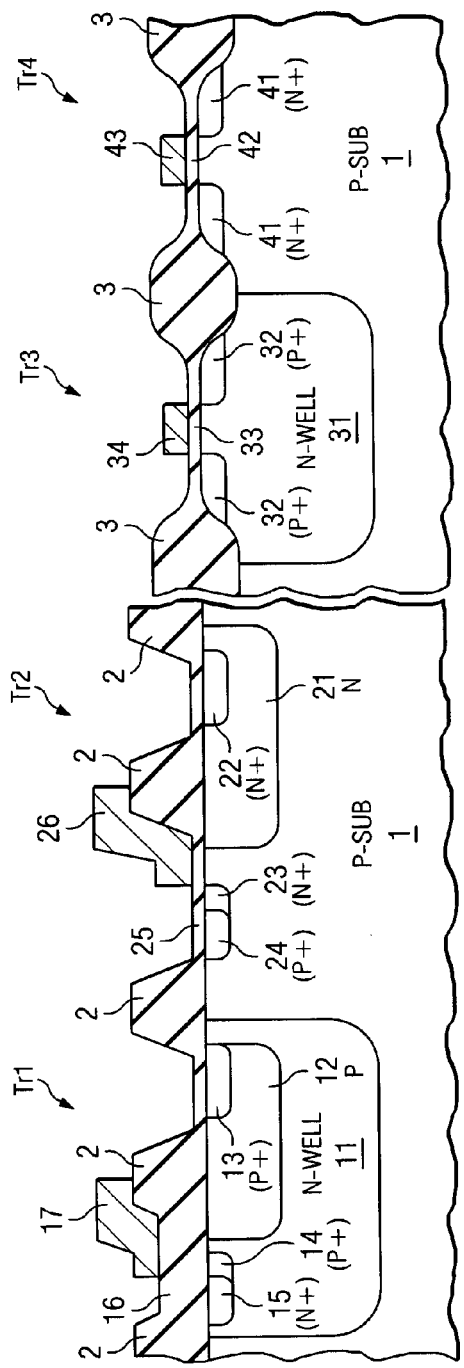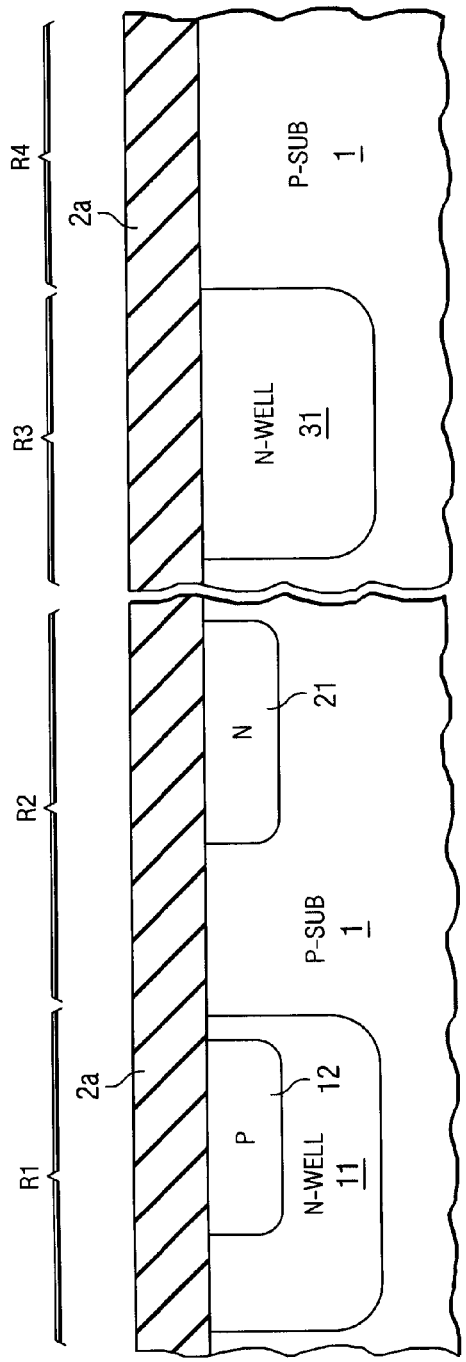
FIG. 1
FIG. 2A

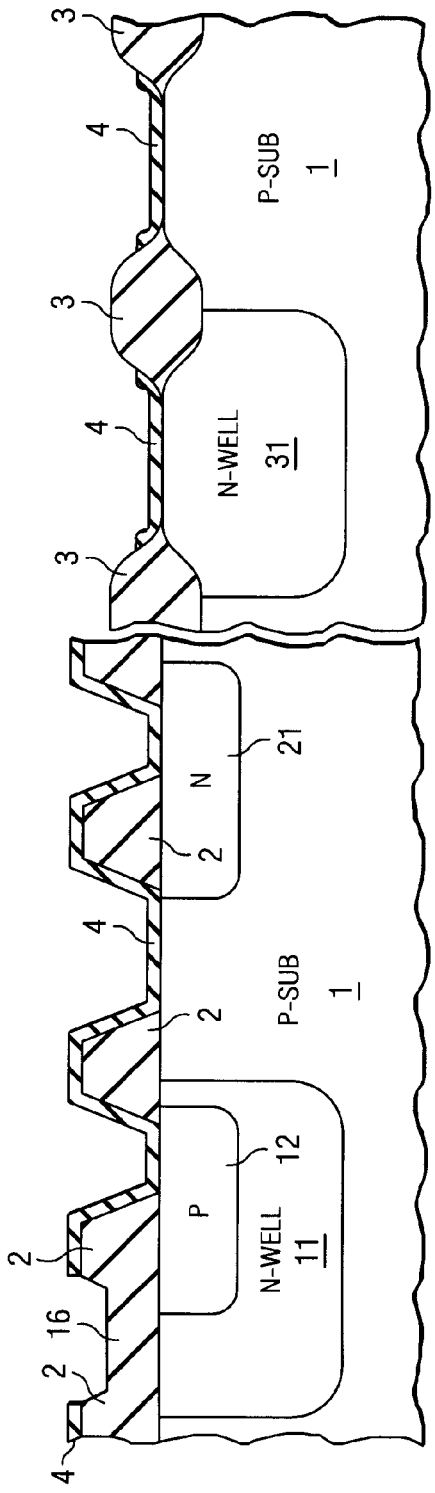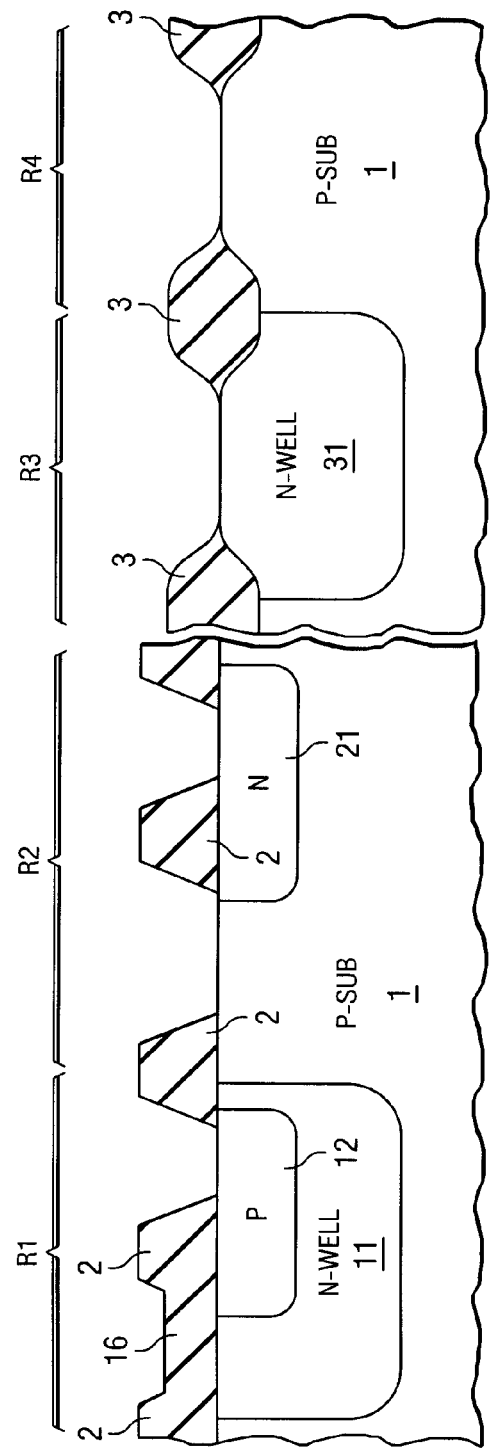

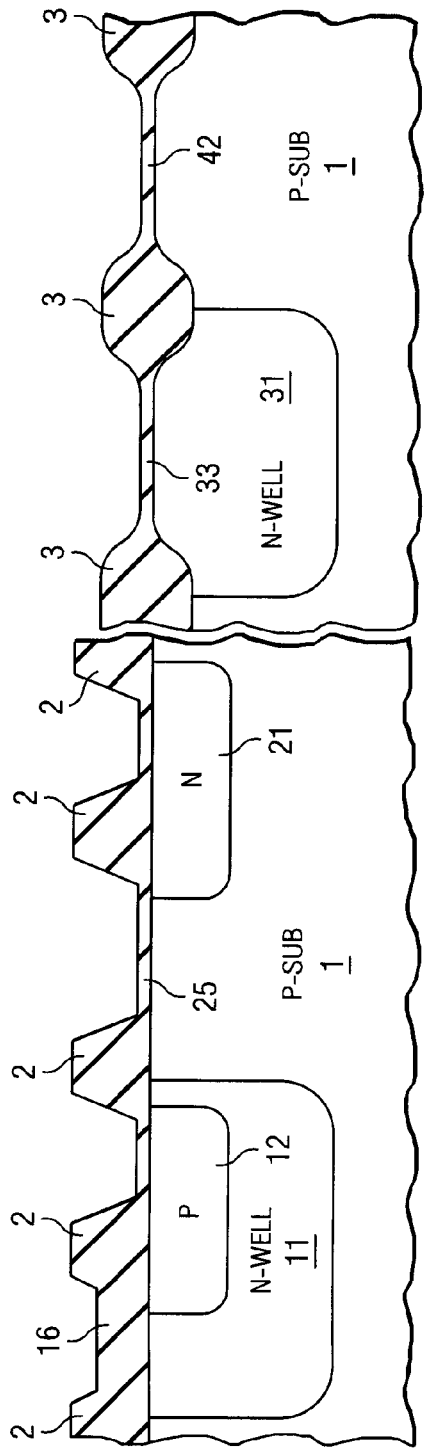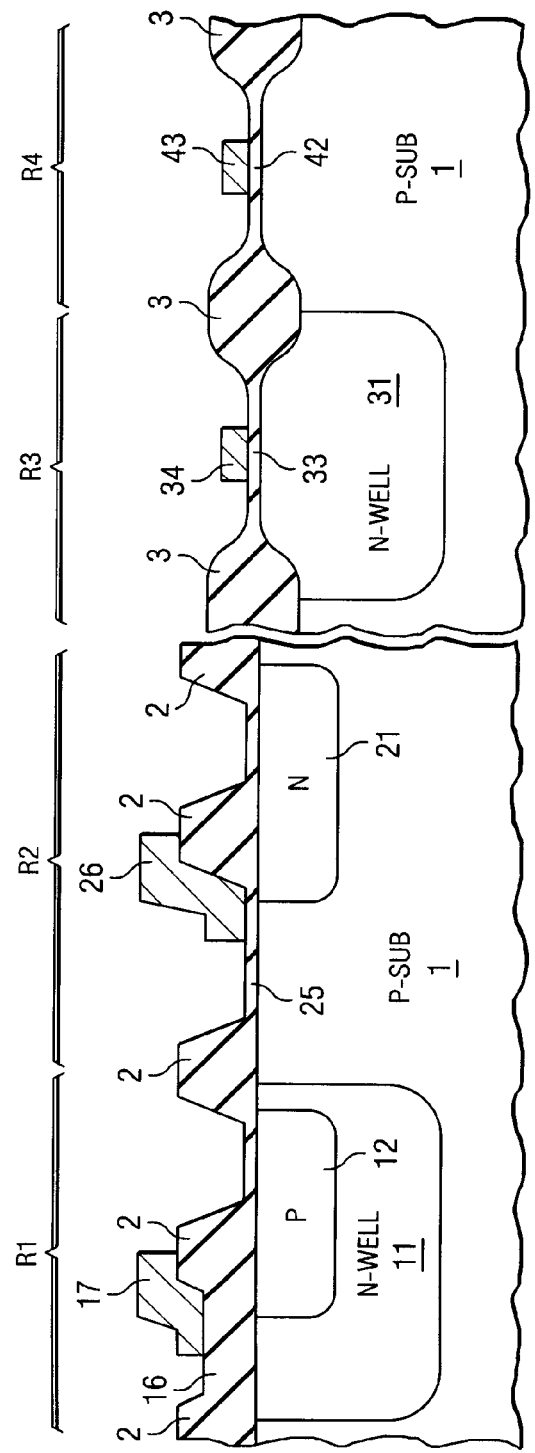

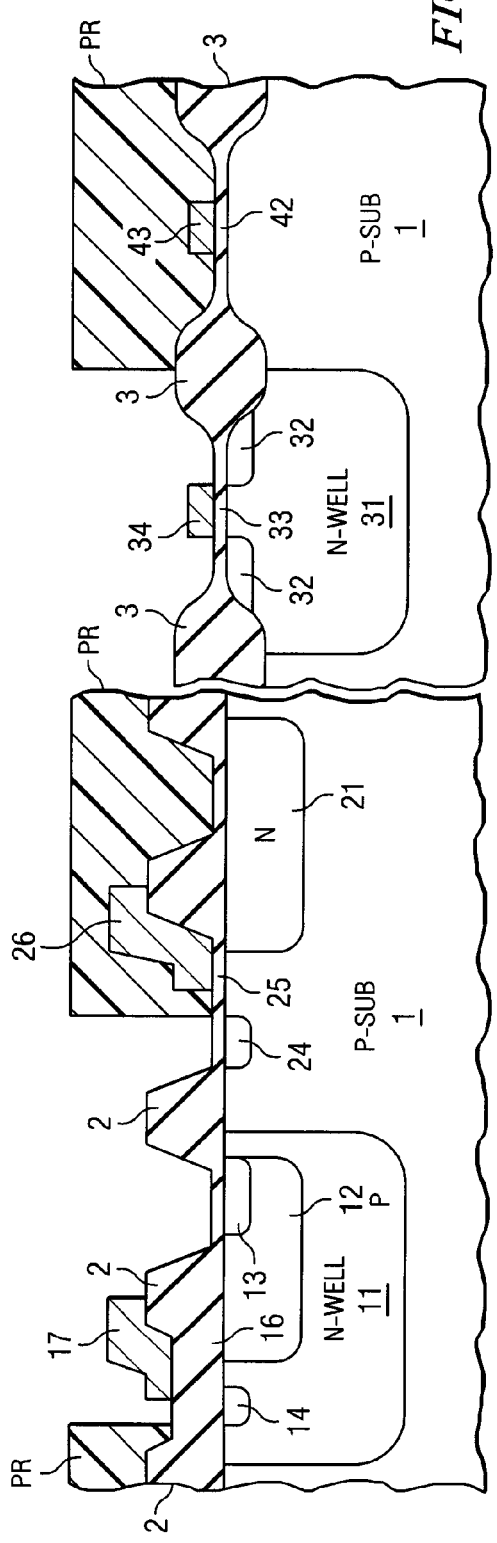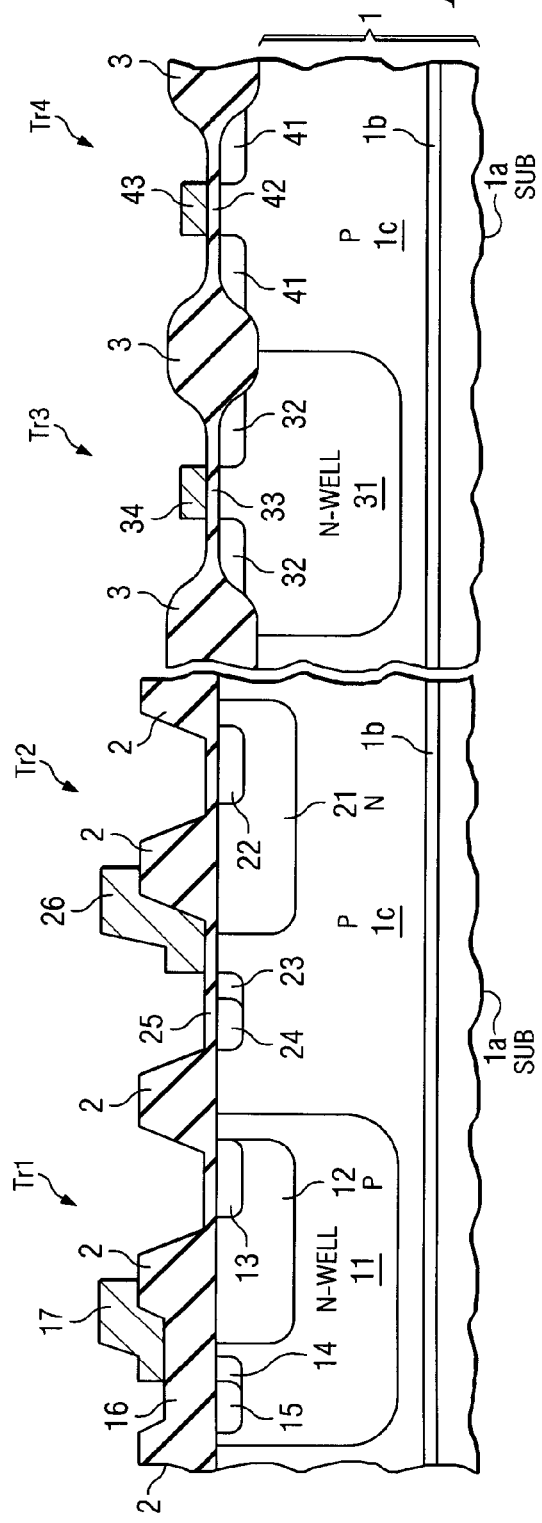
FIG. 5B
FIG. 6

GATE DIELECTRIC/ISOLATION STRUCTURE FORMATION IN HIGH/LOW VOLTAGE REGIONS OF SEMICONDUCTOR DEVICE

This is a division of application Ser. No. 11/266,988 filed Nov. 4, 2005, the entirety of which is incorporated herein by reference, and which claims priority from Japan Application No. 2004-322774 filed Nov. 5, 2004.

BACKGROUND

This relates to a semiconductor device and method of manufacture of a semiconductor device having at least two transistors with different gate insulation film thicknesses.

MOSFET (metal-oxide-semiconductor field-effect transistors) elements are widely used as basic elements in semiconductor devices. In high voltage-rated ICs (integrated circuits), high voltage-rated MOS transistors are used that can be driven with voltages of 10-20 V, or more (hereinafter referred to as "high voltage transistors").

FIG. 7 is a cross section view of a semiconductor device having high and low voltage (that is, high voltage-rated and low voltage-rated) transistors according to a conventional configuration. FIG. 7 shows high voltage PMOS and NMOS transistors Tr1, Tr2 and low voltage PMOS and NMOS transistors Tr3, Tr4, formed on a p-type semiconductor substrate 101. In semiconductor substrate 101, the regions of transistors Tr1, Tr2, Tr3 and Tr4 are separated from each other by means of element-separating insulator film 102.

In the high voltage PMOS transistor formation region, n-type well 111, p-type drain region 112, and p$^+$-type drain region 113 are formed in semiconductor substrate 101. At a prescribed distance from the end portion of p-type drain region 112, p$^+$-type source region 114 is formed on the surface of n-type well 111, and the portion between p-type drain region 112 and p$^+$-type source region 114 becomes the channel-formation region. Also, n$^+$-type back gate 115 is formed adjacent to the side opposite to the channel-formation region of p$^+$-type source region 114. And, gate-insulation film 116 is formed to cover the channel-formation region, and gate electrode 117 is formed as the upper layer on it. This arrangement forms the high voltage PMOS transistor Tr1.

In the high voltage NMOS transistor formation region, n-type drain region 121 and n$^+$-type drain region 122 are formed in semiconductor substrate 101. At a prescribed distance from the end portion of n-type drain region 121, n$^+$-type source region 123 is formed on the surface of semiconductor substrate 101, and the portion between n-type drain region 121 and n$^+$-type source region 123 becomes the channel-formation region. Also, p$^+$-type back gate 124 is formed adjacent to the side opposite the channel-formation region of n$^+$-type source region 123. And, gate-insulation film 125 is formed to cover the channel-formation region, and gate electrode 126 is formed as the upper layer on it. This arrangement forms the high voltage NMOS transistor Tr2.

In the low voltage PMOS transistor formation region, n-type well 131 is formed in semiconductor substrate 101. On its surface, a pair of p$^+$-type source/drain regions 132 are formed separated from each other by a prescribed distance, and the region between them becomes the channel-formation region. Also, gate-insulation film 133 is formed to cover it, and gate electrode 134 is formed as the upper layer on it. This forms the low voltage PMOS transistor Tr3.

In the low voltage NMOS transistor formation region, a pair of n$^+$-type source/drain regions 141 are formed on the surface of semiconductor substrate 101, separated from each other by a prescribed distance, and the region between them becomes the channel-formation region. Also, gate-insulation film 142 is formed to cover it, and gate electrode 143 is formed as the upper layer on it. This forms the low voltage NMOS transistor Tr4.

As shown in the drawings, the various regions on semiconductor substrate 1 are allotted to formation region R1 of high voltage PMOS transistor Tr1, formation region R2 of high voltage NMOS transistor Tr2, formation region R3 of low voltage PMOS transistor Tr3, and formation region R4 of low voltage NMOS transistor Tr4, and the divided regions will be explained.

First, as shown in FIG. 8A, n-type well 111, p-type drain region 112, n-type drain region 121, and n-type well 131 are formed on semiconductor substrate 101 by means of ion implantation, etc. Then, for example, a silicon oxide film or other insulating film 102a is formed on the entire surface. Then, as shown in FIG. 8B, insulating film 102a is subjected to patterning processing to form element-separating insulator films 102. Then, as shown in FIG. 9A, thermal oxidation treatment is performed on the entire surface to form gate-insulation film 116 in high voltage PMOS transistor formation region R1. In this case, insulating film 116a is formed on the surface of semiconductor substrate 101 in high voltage NMOS transistor formation region R2 and low voltage PMOS and NMOS transistor formation regions R3, R4. Then, as shown in FIG. 9B, a pattern of a resist film is formed, and openings are formed on insulating film 116a of high voltage NMOS transistor formation region R2, and low voltage PMOS and NMOS transistor formation regions R3, R4, followed by etching treatment to remove the insulating film 116a. Next, as shown in FIG. 10A, thermal oxidation treatment is performed on the entire surface to form gate-insulation films 125, 133, 142 in high voltage NMOS transistor Tr2 formation region R2, low voltage PMOS transistor Tr3 formation region R3 and low voltage NMOS transistor Tr4 formation region R4. Then, as shown in FIG. 10B, gate electrodes (117, 126, 134, 143) are formed on gate insulated films (116, 125, 133, 142) on high breakthrough PMOS transistor (Tr1) forming region R1, high breakthrough NMOS transistor (Tr2) forming region R2, low breakthrough PMOS transistor (Tr3) forming region R3, and low breakthrough NMOS transistor (Tr4) forming region R4, respectively. Then, in each of high voltage PMOS transistor Tr1 formation region R1, high voltage NMOS transistor Tr2 formation region R2, low voltage PMOS transistor Tr3 formation region R3, and low voltage NMOS transistor Tr4 formation region R4, gate electrode, resist film, etc. are used as masks for ion implantation to form source/drain regions connected to the channel-formation regions of the various transistor formation regions.

In addition to the aforementioned manufacturing method, there is also the manufacturing method described in Japanese Kokai Patent Application No. 2004-207498.

SUMMARY

In order to ensure the film thickness of the element-separating insulator film so as to guarantee the characteristics of the high voltage transistors, the step height of the element-separating insulator film becomes larger. If such an element-separating insulator film is used as is in the low voltage transistors, it becomes difficult to realize smaller transistors and a higher integration degree for logic MOS transistors, etc. that have an especially higher element density.

The invention provides a semiconductor device comprising, in a described implementation, a semiconductor substrate; a first element-separating insulator film that is formed and selectively left on the semiconductor substrate so as to perform element separation for the first transistor-formation region; a second element-separating insulator film that is formed by selective oxidation of the surface layer of the semiconductor substrate so as to perform element separation for the second transistor-formation region; a first transistor that is formed in the region separated by the first element-separating insulator film and has a first channel-formation region and a first source/drain region formed on the semiconductor substrate, a first gate-insulation film with a first film thickness formed on the first channel-formation region, and a first gate electrode formed on the first gate-insulation film; and a second transistor that is formed in the region separated by the second element-separating insulator film and has a second channel-formation region and a second source/drain region formed on the semiconductor substrate, a second gate-insulation film with a second film thickness less than the first film thickness and formed on the second channel-formation region, and a second gate electrode formed on the second gate-insulation film.

For the semiconductor device of the invention, the first transistor-formation region is selectively left on the semiconductor substrate so that element separation is realized, and the first element-separating insulator film is formed. On the other hand, the surface layer portion of the semiconductor substrate is selectively oxidized so that element separation is realized for the second transistor-formation region, and the second element-separating insulator film is formed. In the regions separated by the first element-separating insulator film, there are the first transistor composed of the first channel-formation region and first source/drain region formed on the semiconductor substrate, the first gate-insulation film with the first film thickness formed on the first channel-formation region, and the first gate electrode formed on the first gate-insulation film, and the second transistor composed of the second channel-formation region and second source/drain region formed on the semiconductor substrate, the second gate-insulation film with a second film thickness less than the first film thickness and formed on the second channel-formation region, and the second gate electrode formed on the second gate-insulation film.

For example implementations of the semiconductor device of the invention, it is preferred that the first gate-insulation film and the second element-separating insulator film have substantially the same film thickness. Also, it is preferred that the first transistor be a high voltage transistor and the second transistor be a low voltage transistor. In addition, it is preferred that a back gate region be formed adjacent to the first source/drain region. It is also preferred that a transistor of the first electroconductive type and a transistor of the second electroconductive type be formed.

For implementation of example embodiments of the semiconductor device of the invention, the following scheme is preferred: In the region separated by the first element-separating insulator film, there is also a third transistor that has a third channel-formation region and a third source/drain region formed on the semiconductor substrate, a third gate-insulation film with a film thickness less than the first film thickness and formed on the third channel-formation region, and a third gate electrode formed on the third gate-insulation film.

In addition, it is preferred that the semiconductor substrate be a substrate having an SOI (semiconductor on insulator) structure having a semiconductor layer on an insulating film on the substrate. It is even more preferred that on the substrate of the SOI structure, the region of the semiconductor layer where the first transistor be formed is individually insulated and separated by an insulating layer formed from the surface of the semiconductor layer to reach the insulating film.

The invention also provides a method for manufacturing semiconductor devices comprising, in a described implementation, a step in which the first transistor-formation region of the semiconductor substrate having the first channel-formation region is selectively left for element separation to form the first element-separating insulator film; a step in which the surface layer portion of the semiconductor substrate is selectively oxidized for element separation of the second transistor-formation region of the semiconductor substrate having the second channel-formation region to form the second element-separating insulator film; a step in which the first gate-insulation film with the first film thickness is formed on the surface of the semiconductor substrate in the first transistor-formation region; a step in which the second gate-insulation film with the second film thickness less than the first film thickness is formed on the surface of the semiconductor substrate in the second transistor-formation region; a step in which the first gate electrode is formed on the first gate-insulation film, and the second gate electrode is formed on the second gate-insulation film; and a step in which the first source/drain region connected to the first channel-formation region is formed, and the second source/drain region connected to the second channel-formation region is formed.

In example implementations of the described method, the first transistor-formation region of the semiconductor substrate having the first channel-formation region is selectively left for element separation to form the first element-separating insulator film. Then, the surface layer portion of the semiconductor substrate is selectively oxidized for element separation of the second transistor-formation region of the semiconductor substrate having the second channel-formation region to form the second element-separating insulator film. Then, the first gate-insulation film with the first film thickness is formed on the surface of the semiconductor substrate in the first transistor-formation region; then the second gate-insulation film with the second film thickness less than the second film thickness is formed on the surface of the semiconductor substrate in the second transistor-formation region. Then, the first gate electrode is formed on the first gate-insulation film, and the second gate electrode is formed on the second gate-insulation film. Then, the first source/drain region connected to the first channel-formation region is formed, and the second source/drain region connected to the second channel-formation region is formed.

In specific example implementations of the method of the invention, it is preferred that the step of forming the second element-separating insulator film and the step of forming the first gate-insulation film be carried out simultaneously. In some examples, the following implementation is preferred: The step of forming the first element-separating insulator film includes the following operation steps: a step in which an insulating film is formed on the entire surface of the semiconductor substrate, a step in which the first mask layer for protecting the formation region of the first element-separating insulator film is formed on the insulating film, and a step in which the first mask layer is used to perform patterning processing for the insulating film so as to selectively leave it in the formation region of the first element-separating insulator film to form the first element-separating insulator film.

In some examples, the step of forming the second element-separating insulator film includes the following operation steps: a step in which the second mask layer protecting the region excluding the formation region of the second element-separating insulator film is formed on the semiconductor substrate, and a step in which the surface layer portion of the semiconductor substrate in the formation region of the second element-separating insulator film exposed from the second mask layer is selectively oxidized to form the second element-separating insulator film.

Also, it is sometimes preferred that the step of forming the first gate-insulation film contain the following operation steps: a step in which the first gate-insulation film is formed, a step in which the second mask layer protecting the region excluding the first transistor-formation region is formed on the semiconductor substrate, and a step in which the surface layer portion of the semiconductor substrate in the first transistor-formation region exposed from the second mask layer is selectively oxidized to form the first gate-insulation film.

BRIEF DESCRIPTION OF THE DRAWINGS

FIG. 1 is a cross-sectional view of a semiconductor device according to a first embodiment of the present invention.

FIGS. 2A and 2B are cross-sectional views illustrating the steps of manufacturing of the semiconductor device in the first embodiment of the present invention.

FIGS. 3A and 3B are cross-sectional views illustrating the manufacturing process of the semiconductor device in the first embodiment of the present invention.

FIGS. 4A and 4B are cross-sectional views illustrating the steps of manufacturing of the semiconductor device in the first embodiment of the present invention.

FIGS. 5A and 5B are cross-sectional views illustrating the manufacturing process of the semiconductor device in the first embodiment of the present invention.

FIG. 6 is a cross-sectional view illustrating the semiconductor device in the second embodiment of the present invention.

DETAILED DESCRIPTION OF EXAMPLE EMBODIMENTS

Figure 2B:
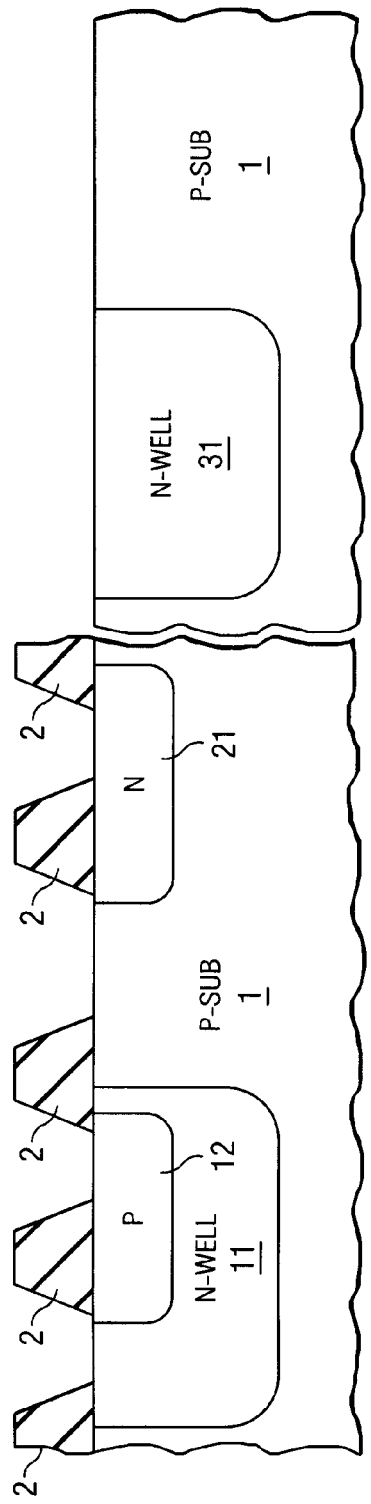

In the semiconductor device of the invention, the first transistor is separated by the first element-separating insulator film that is selectively left to realize element separation for the first transistor formation region. Consequently, it is possible to guarantee good characteristics of the high voltage transistor. On the other hand, the second transistor is separated by the second element-separating insulator film formed by selective oxidation of the semiconductor substrate. Consequently, it is easy to realize smaller elements and a high integration degree.

In the method for manufacturing the semiconductor device of the present invention, the first element-separating insulator film is formed in the first transistor formation region, by being selectively left on the semiconductor substrate, so that good characteristics of the high voltage transistor, etc. can be guaranteed. On the other hand, the second element-separating insulator film is formed by means of selective oxidation of the semiconductor substrate in the second transistor formation region, so that it is easy to realize smaller elements and high integration degree.

FIG. 1 is a cross-sectional view of a first example embodiment of semiconductor device according to the principles of the invention.

For example, on semiconductor substrate 1, high voltage PMOS transistor Tr1, high voltage NMOS transistor Tr2, low voltage PMOS transistor Tr3 and low voltage NMOS transistor Tr4 are formed.

In the high voltage PMOS transistor formation region formed by means of first element-separating insulator film 2 of semiconductor substrate 1, n-type well 11 is formed in semiconductor substrate 1; p-type drain region 12 is formed on the surface of n-type well 11 so that it is enclosed in n-type well 11; and, on the surface of p-type drain region 12, $p^+$-type drain region 13 is formed so that it is enclosed in p-type drain region 12.

On the other hand, at a prescribed distance from the end portion of p-type drain region 12, $p^+$-type source region 14 (p-type drain region 12, $p^+$-type drain region 13 and $p^+$-type source region 14 correspond to the first source/drain region) is formed on the surface of n-type well 11, so that it is enclosed in n-type well 11, and the portion between p-type drain region 12 and $p^+$-type source region 14 becomes the channel-formation region.

Also, $n^+$-type back gate 15 is formed adjacent to the side opposite the channel-formation region of $p^+$-type source region 14.

Then, gate-insulation film (first gate-insulation film) 16 with film thickness of 400 nm and made of, say, silicon oxide, is formed to cover at least the channel-formation region between the p-type drain region 12 and $p^+$-type source region 14, and gate electrode (first gate electrode) 17 made of, say, polysilicon, is formed as the upper layer on top of it.

In this way, high voltage PMOS transistor Tr1 (first transistor) is formed.

Also, in the high voltage NMOS transistor formation region with element separation realized by first element-separating insulator film 2 of semiconductor substrate 1, n-type drain region 21 is formed in semiconductor substrate 1, and then $n^+$-type drain region 22 is formed such that it is enclosed in the n-type drain region 21.

On the other hand, separated by a prescribed distance from the end portion of n-type drain region 21, $n^+$-type source region 23 is formed on the surface of semiconductor substrate 1, and the portion between n-type drain region 21 and $n^+$-type source region 23 becomes the channel-formation region.

Also, $p^+$-type back gate 24 is formed adjacent to the side opposite the channel-formation region of $n^+$-type source region 23.

Gate-insulation film 25 with a film thickness of 14 nm and made of, say, silicon oxide, is formed to cover at least the channel-formation region between the n-type drain region 21 and $n^+$-type source region 23. Then, gate electrode 26 made of polysilicon is formed as the upper layer on top of it.

High voltage NMOS transistor Tr2 is formed as explained above.

Also, in the low voltage PMOS transistor formation region with element separation realized by second element-separating insulator film 3 of semiconductor substrate 1, n-type well 31 is formed in semiconductor substrate 1, and, on the surface of n-type well 31, a pair of P+ source/drain regions (second source/drain regions) 32 separated prescribed distance from one another are formed. The portion between the pair of $p^+$-type source/drain regions 32 becomes the channel-formation region.

Gate-insulation film (second gate-insulation film) 33 with film thickness of 14 nm and made of, say, silicon oxide, is formed to cover at least the channel-formation region between the pair of p+-type source/drain regions 32, and gate electrode (second gate electrode) 34 made of, say, polysilicon is formed as the upper layer on top of it.

As explained above, low voltage PMOS transistor Tr3 (second transistor) is formed.

In the low voltage NMOS transistor formation region with element separation realized by second element-separating insulator film 3 of semiconductor substrate 1, a pair of n+-type source/drain regions 41 separated from each other by a prescribed distance are formed on the surface of semiconductor substrate 1. The portion between the pair of n+-type source/drain regions 41 (second source/drain regions) becomes the channel-formation region.

Gate-insulation film (second gate-insulation film) 42 with film thickness of 14 nm and made of, say, silicon oxide, is formed to cover at least the channel-formation region between the pair of n+-type source/drain regions 41. Gate electrode (second gate electrode) 43 made of, say, polysilicon, is formed as the upper layer on top of it.

Low voltage NMOS transistor Tr4 (second transistor) is formed as explained above.

In the aforementioned semiconductor device, first element-separating insulator film 2 is the element-separating insulator film formed and selectively left on semiconductor substrate 1 so that element separation is performed for the high voltage PMOS transistor and high voltage NMOS transistor. For example, it has a film thickness of about 600 nm, and there is no corrosion of the drain region in the manufacturing process of LOCOS element-separating insulator film. Consequently, it is possible to realize high-performance high voltage transistors with a low on-resistance. This first element-separating insulator film 2 is formed by etching the insulating layer deposited on semiconductor substrate 1 in a prescribed pattern.

On the other hand, second element-separating insulator film 3 is an element-separating insulator film formed by selective oxidation of the surface layer portion of semiconductor substrate 1 so that element separation is realized for the formation regions of the low voltage PMOS transistor and low voltage NMOS transistor, and it is a so-called LOCOS element-separating insulator film. For example, when a film with thickness about 400 nm is used as an insulating film to separate the logic MOS transistors or other low voltage transistors, it is possible to make progress in forming smaller elements with higher integration.

For the semiconductor device pertaining to the aforementioned embodiment, the high voltage PMOS transistor (first transistor) is separated by the first element-separating insulator film formed and selectively left to separate elements for the formation region of the high voltage PMOS transistor. Consequently, good characteristics of high voltage transistors can be established. On the other hand, the low voltage PMOS transistor and low voltage NMOS transistor (second transistors) are separated by the second element-separating insulator film (LOCOS element-separating insulator film) formed by selective oxidation of the semiconductor substrate. Consequently, it is easy to realize smaller elements and higher integration.

In the following, an explanation will be given regarding the manufacturing method of the semiconductor device pertaining to the embodiment with reference to the figures.

In the figures, the regions on semiconductor substrate 1 are allotted to high voltage PMOS transistor Tr1 formation region R1, high voltage NMOS transistor Tr2 formation region R2, low voltage PMOS transistor Tr3 formation region R3, and low voltage NMOS transistor Tr4 formation region R4. In the following, an explanation will be given regarding them.

On semiconductor substrate 1, by means of ion implantation, n-type well 11 and p-type drain region 12 are formed in high voltage PMOS transistor Tr1 formation region R1; high voltage NMOS transistor Tr2 formation region R2 and n-type drain region 21 are formed, and n-type well 31 is formed in low voltage PMOS transistor Tr3 formation region R3. The transistor formation regions each have a channel-formation region.

First, as shown in FIG. 2A, silicon oxide or other insulating film 2a with a film thickness of 600 nm is formed on the entire surface of the semiconductor substrate 1.

Then, as shown in FIG. 2B, a first mask layer not shown in the figure that protects the formation region of the first element-separating insulator film is formed on insulating film 2a. By means of the obtained first mask layer, insulating film 2a is patterned by processing to be selectively left in the formation region of the first element-separating insulator film, thus forming first element-separating insulator film 2.

First element-separating insulator film 2 is used as the element-separating insulator film in high voltage PMOS transistor Tr1 formation region R1 and high voltage NMOS transistor Tr2 formation region R2.

Figure 3A:
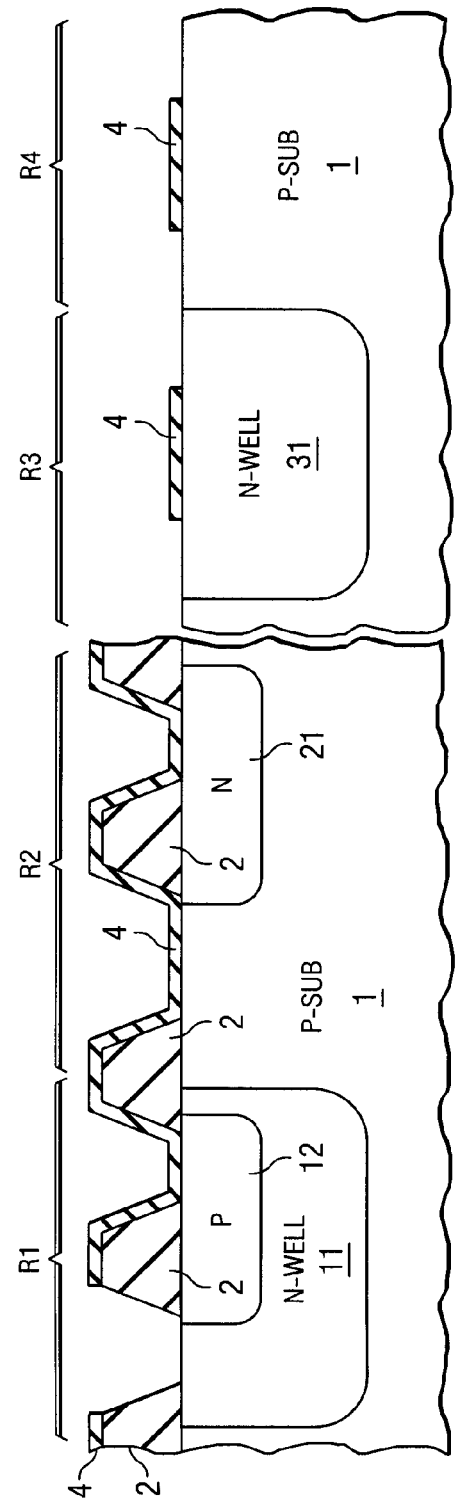
Figure 7:
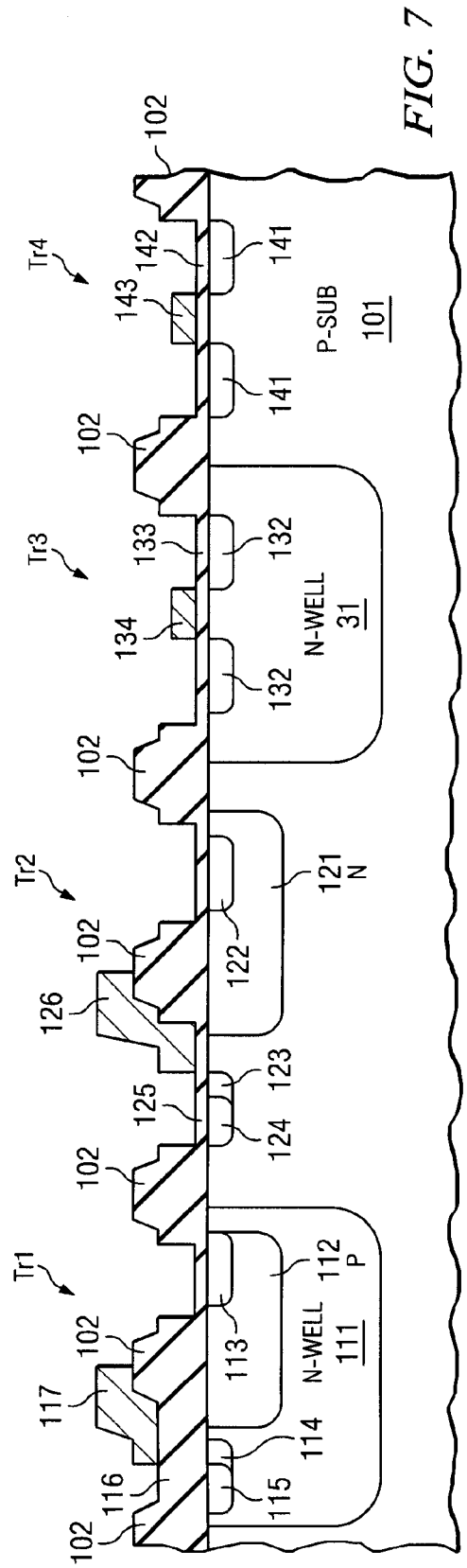
FIG. 7 is a cross-sectional view illustrating the semiconductor device in the prior art.
Figure 8A:
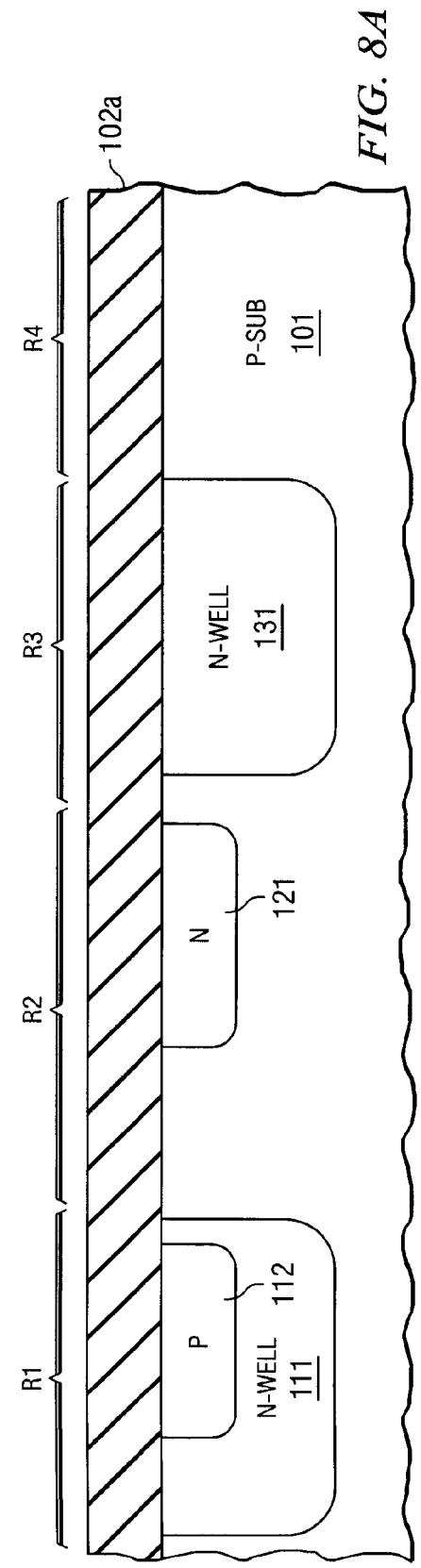
FIGS. 8A and 8B are cross-sectional views illustrating the manufacturing process of the semiconductor device in the prior art.
Figure 8B:
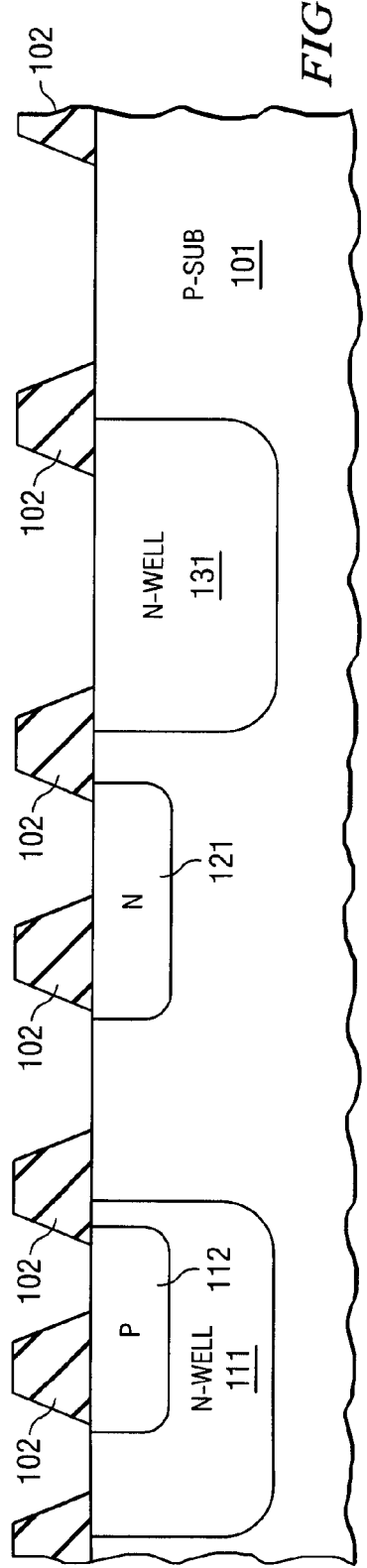
Figure 9A:
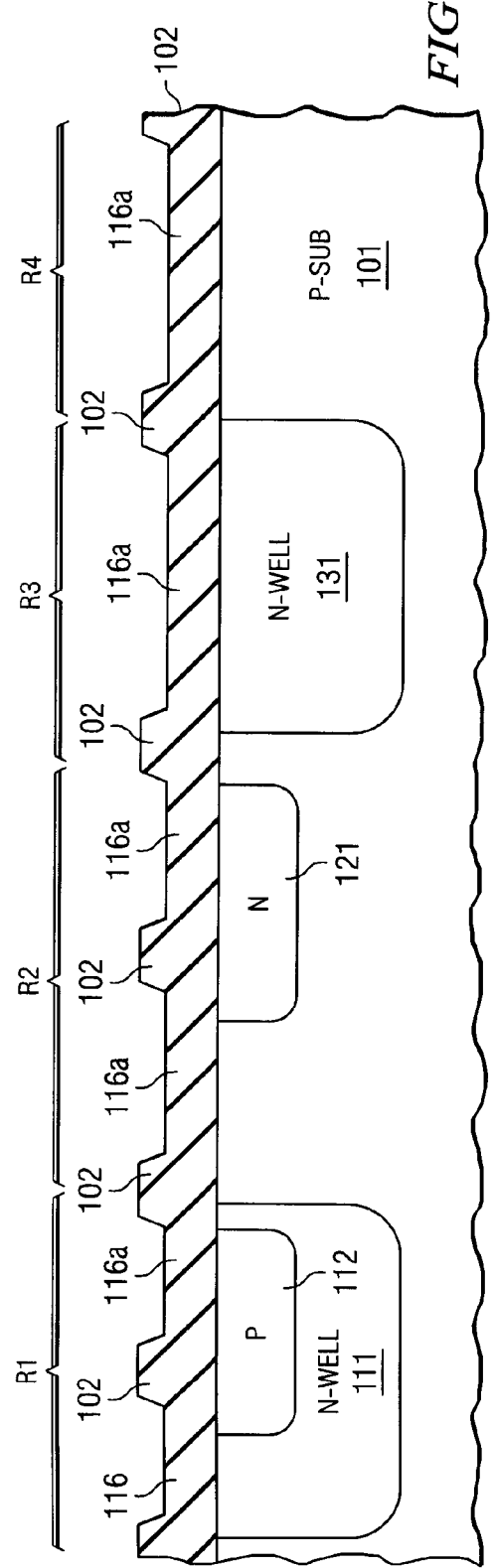
FIGS. 9A and 9B are cross-sectional views illustrating the manufacturing process of the semiconductor device in the prior art.
Figure 9B:
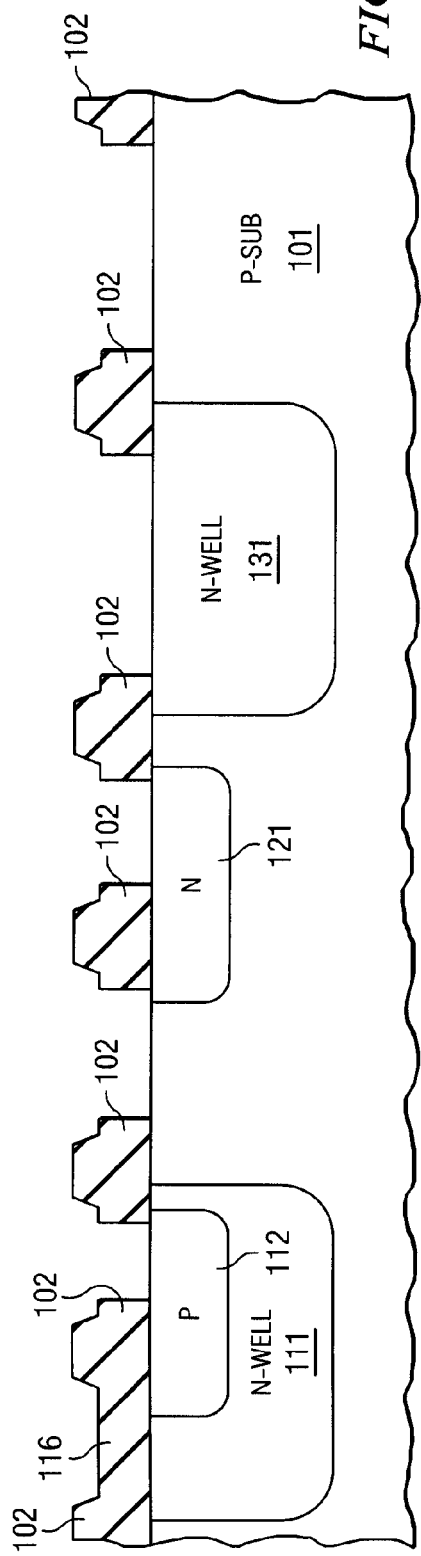
Figure 10A:
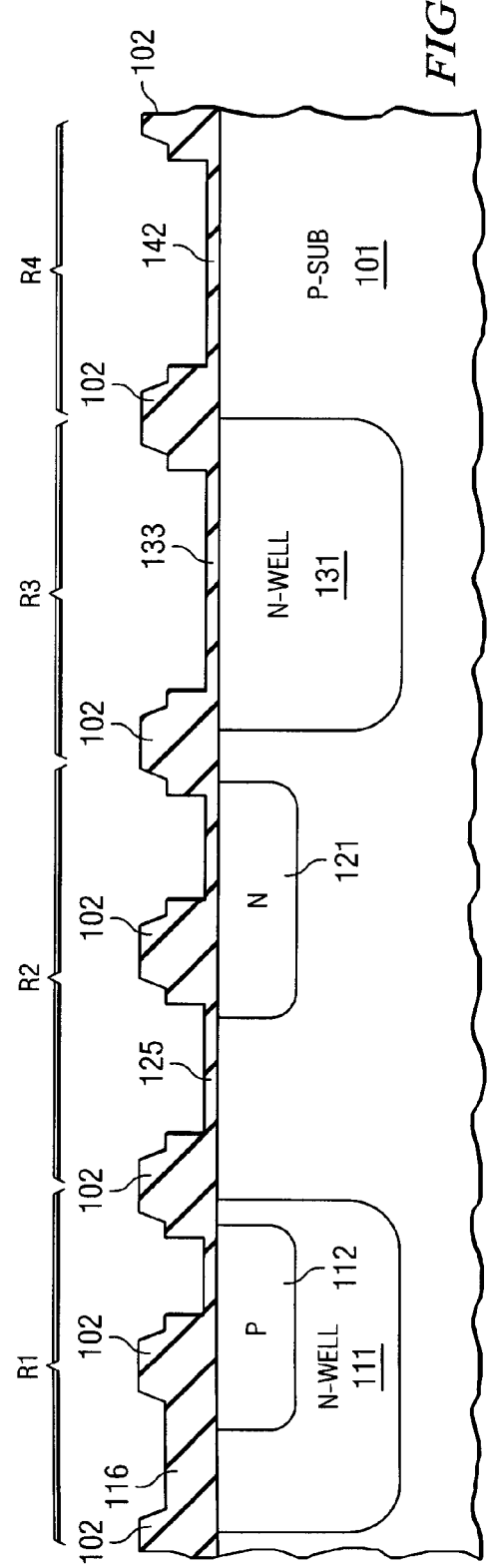
FIGS. 10A and 10B are cross-sectional views illustrating the manufacturing process of the semiconductor device in the prior art.
Figure 10B:
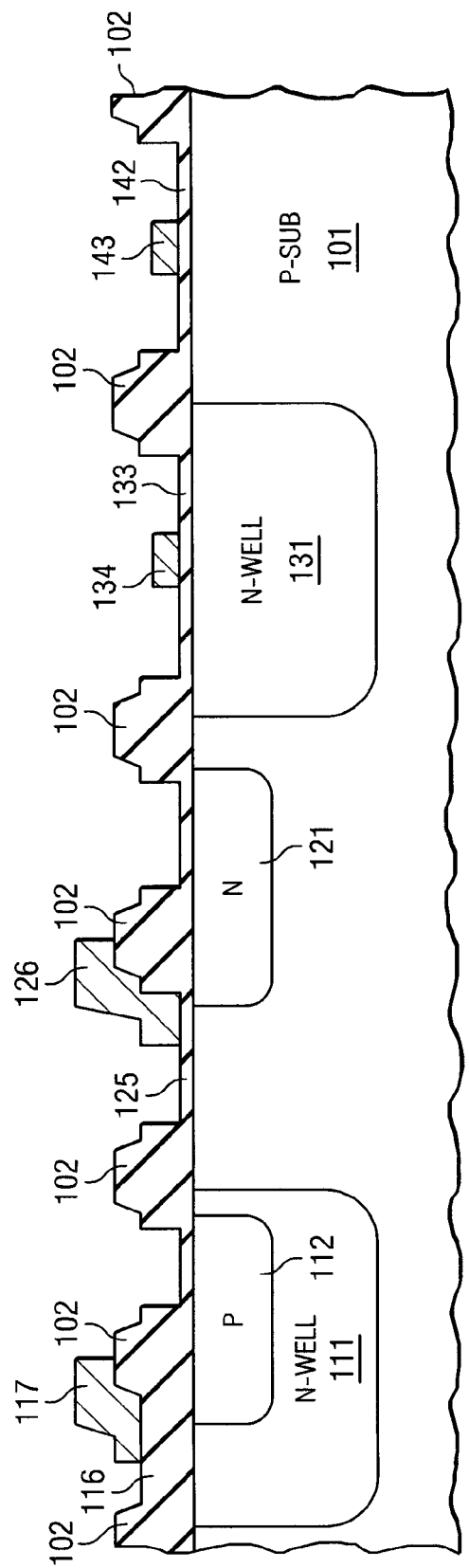

Then, as shown in FIG. 3A, by forming and patterning a silicon nitride film, for example, second mask layer 4 is formed with opening in the formation region of the element-separating insulator film for low voltage PMOS transistor formation region R3 and low voltage NMOS transistor formation region R4 of semiconductor substrate 1.

Second mask layer 4 is formed as a pattern that opens in the channel-formation region in high voltage PMOS transistor formation region R1.

Then, as shown in FIG. 3B, in low voltage PMOS transistor formation region R3 and low voltage NMOS transistor formation region R4 of semiconductor substrate 1, the surface of semiconductor substrate 1 in the opening portion of second mask layer 4 is selectively oxidized by means of thermal oxidation processing with second mask layer 4 as a mask, to form second element-separating insulator film 4. For example, thermal oxidation treatment is performed at 900° C. for about 300 min to form an element-separating insulator film with a film thickness of about 400 nm.

On the other hand, in high voltage PMOS transistor formation region R1, the surface of semiconductor substrate 1 is selectively oxidized in the channel-formation region to form the second element-separating insulator film, and at the same time, gate-insulation film 16 with a film thickness of about 400 nm, that is, substantially identical to that of the second element-separating insulator film, is formed.

Then, as shown in FIG. 4A, second mask layer 4 is selectively removed by means of etching treatment.

Then, as shown in FIG. 4B, in the channel-formation region of each of high voltage NMOS transistor Tr2 formation region R2, low voltage PMOS transistor Tr3 formation region R3, and low voltage NMOS transistor Tr4 formation region R4, and gate-insulation films 25, 33, 42 are formed simultaneously on the surface of semiconductor substrate 1 by means of thermal oxidation on the entire surface. For example, gate-insulation films 25, 33, 42 with a film thickness of about 14 nm are formed by means of thermal oxidation treatment at 850° C. for about 7 min.

In this way, gate-insulation films 25, 33, 42 for high voltage NMOS transistor Tr2, low voltage PMOS transistor Tr3 and low voltage NMOS transistor Tr4 are formed thinner than the gate-insulation film of high voltage PMOS transistor Tr1.

On the other hand, in high voltage PMOS transistor Tr1 formation region R1, the same insulating film as described above is formed to cover the surface of the semiconductor substrate in the drain region instead of the channel-formation region.

Then, as shown in FIG. 5A, a CVD (chemical vapor deposition) method or the like is used to deposit polysilicon on the entire surface, and by means of etching with a resist film pattern, gate electrodes 17, 26, 34, 43 are formed as the upper layer above gate-insulation films 16, 25, 33, 42 in high voltage PMOS transistor Tr1 formation region R1, high voltage NMOS transistor Tr2 formation region R2, low voltage PMOS transistor Tr3 formation region R3, and low voltage NMOS transistor Tr4 formation region R4.

Then, on each of high voltage PMOS transistor Tr1 formation region R1, high voltage NMOS transistor Tr2 formation region R2, low voltage PMOS transistor Tr3 formation region R3, and low voltage NMOS transistor Tr4 formation region R4, ion implantation is performed with the gate electrode, resist film, etc. used as mask to form the source/drain regions connected to the channel-formation regions of the various transistor formation regions.

For example, as shown in FIG. 5B, a patterned resist film PR with openings formed for the p-type impurity implantation region is formed, and p-type impurity is ion-implanted to form $p^+$-type drain region 13, $p^+$-type source region 14, $p^+$-type back gate 24, and $p^+$-type source/drain regions 32.

Then, a patterned resist film with openings formed for the n-type impurity implantation region is formed, and n-type impurity is ion-implanted to form $n^+$-type back gate 15, $n^+$-type drain region 22, $n^+$-type source region 23, and $n^+$-type source/drain regions 41.

In the aforementioned operation, a semiconductor device with the structure shown in FIG. 1 is obtained.

In the manufacturing method of a semiconductor device in the aforementioned embodiment, it is possible to guarantee good characteristics of the high voltage transistors, etc. because the first element-separating insulator film is formed and selectively left on the semiconductor substrate in the formation region of the high voltage PMOS transistor (first transistor). On the other hand, it is easy to realize smaller elements and a high integration degree because the second element-separating insulator film (LOCOS element-separating insulator film) is formed by selective oxidation of the semiconductor substrate in the formation region of the low voltage PMOS transistor and low voltage NMOS transistor (second transistor).

Also, by simultaneous formation of the gate-insulation film 16 of high voltage PMOS transistor and second element-separating insulator film 3, it is possible to shorten the thermal process, and to shorten the manufacturing process.

In addition, by shortening the thermal process, it is possible to maintain good characteristics of the element for which excessive thermal treatment is undesired.

For example, in the prior art, for the low voltage PMOS transistor and low voltage NMOS transistor, the gate length has a limit of about 2 μm. However, by means of this embodiment, with minimal change in the manufacturing process, it is possible to form a narrower structure, with a gate length of about 0.6 μm, and this is significantly effective in increasing the integration degree of the logic CMOS transistor.

Second Embodiment

FIG. 6 is a cross-sectional view of the semiconductor device of this embodiment.

The design is the same as that of the first embodiment. Semiconductor substrate 1 has an SOI (semiconductor on insulator) structure in which p-type silicon semiconductor layer 1c is laminated on a silicon oxide or other insulating film 1b on substrate 1a. Just as in the first embodiment, high voltage PMOS transistor Tr1, high voltage NMOS transistor Tr2, low voltage PMOS transistor Tr3 and low voltage NMOS transistor Tr4 are formed on p-type silicon semiconductor layer 1c.

The remaining features of the constitution are the same as those in the first embodiment.

In the semiconductor device of this embodiment, just as in the first embodiment, high voltage PMOS transistors (first transistors) are separated by the first element-separating insulator film formed and selectively left for element separation of the formation region of the high voltage PMOS transistor. Consequently, good characteristics of the high voltage transistors can be maintained. On the other hand, the low voltage PMOS transistor and the low voltage NMOS transistor (second transistors) are separated by the second element-separating insulator film (LOCOS element-separating insulator film) formed by selective oxidation of the semiconductor substrate. Consequently, smaller elements and higher integration can be realized easily.

In this embodiment, high voltage PMOS transistor Tr1 and high voltage NMOS transistor Tr2 are not distinguished from one another, and they are formed in the same semiconductor layer 1c. An insulating layer from the surface of semiconductor layer 1c to insulating film 1b is formed to surround each high voltage transistor, so that high voltage PMOS transistor Tr1 and high voltage NMOS transistor Tr2 are individually separated. In this case, the various high voltage transistors are formed individually in the semiconductor layers divided by the insulating layer.

When excessive heat treatment is performed on the low voltage PMOS transistor and low voltage NMOS transistor, contamination is accumulated in the SOI substrate of this embodiment, and the characteristics degrade, and this is undesirable. Now, in this embodiment, because the thermal process can be shortened, excessive heat treatment can be avoided, and the aforementioned problem can be avoided. This is especially effective when the high voltage transistors are individually separated as they are formed.

The present invention is not limited to this scheme. In the above explanation, the semiconductor device has two types of transistors with different voltage ratings, that is, high voltage transistors and low voltage transistors. However, the present invention is not limited to this scheme. The present invention may also be adopted for semiconductor devices having two types of transistors with different film thicknesses of the gate-insulation films.

Also, as long as the essential teaching of the present invention is observed, various changes may be made.

The semiconductor device of the present invention can be adopted for semiconductor devices having two types of transistors having different film thicknesses of the gate-insulation films.

The manufacturing method of the semiconductor device of the present invention can be adopted in manufacturing semiconductor devices having two types of transistors with different film thicknesses of the gate-insulation films.

The invention claimed is:

1. A method of manufacturing a semiconductor device, comprising:

forming a layer of insulating material over high voltage PMOS, high voltage NMOS, and low voltage MOS transistor formation regions of a semiconductor substrate;

patterning the layer of insulating material to form first isolation structures for the high voltage PMOS and for the high voltage NMOS transistor formation regions;

forming and patterning a layer of masking material to cover channel regions of the high voltage NMOS and low voltage MOS transistor formation regions;

with the channel regions of the high voltage NMOS and low voltage MOS transistor formation regions covered, conducting a first thermal oxidation to form a first gate dielectric layer over a channel region of the high voltage PMOS transistor formation region and to simultaneously form second isolation structures for the low voltage MOS transistor formation region;

following the first thermal oxidation, removing the patterned layer of masking material from the channel regions of the high voltage NMOS and low voltage MOS transistor formation regions; and following removal of the patterned layer of masking material, conducting a second thermal oxidation to form second gate dielectric layers simultaneously over the channel regions of the high voltage NMOS and low voltage MOS transistor formation regions; the second gate dielectric layers being formed to a thickness less than the thickness to which the first gate dielectric layer is formed.

2. The method of claim 1, wherein the semiconductor substrate comprises silicon and wherein the first and second dielectric layers comprise silicon oxide.

3. The method of claim 2, wherein the layer of masking material comprises silicon nitride.

4. The method of claim 3, wherein the layer of insulating material comprises silicon oxide.

5. The method of claim 4, wherein the second thermal oxidation is performed at a lower temperature and for a substantially shorter time than the first thermal oxidation.

6. The method of claim 5, wherein the second thermal oxidation is performed at 850° C. for about 7 minutes and the first thermal oxidation is performed at 900° C. for about 300 minutes.

7. The method of claim 4, wherein the first gate dielectric layer and second isolation structures are formed to a thickness of about 400 nm and the second gate dielectric layers are formed to a thickness of about 14 nm.

8. The method of claim 4, further comprising forming a layer of gate electrode material comprising polysilicon over the first and second gate dielectric layers.

9. A method of manufacturing a semiconductor device, comprising:

forming a layer of insulating material over high voltage PMOS, high voltage NMOS, low voltage PMOS and low voltage MOS transistor formation regions of a semiconductor substrate;

patterning the layer of insulating material to form first isolation structures for the high voltage PMOS and for the high voltage NMOS transistor formation regions;

forming and patterning a layer of masking material to cover channel regions of the high voltage NMOS, low voltage PMOS and low voltage NMOS transistor formation regions;

with the channel regions of the high voltage NMOS, low voltage PMOS and low voltage NMOS transistor formation regions covered, conducting a first thermal oxidation to form a first gate dielectric layer over a channel region of the high voltage PMOS transistor formation region and to simultaneously form second isolation structures for the low voltage PMOS and low voltage NMOS transistor formation regions;

following the first thermal oxidation, removing the patterned layer of masking material from the channel regions of the high voltage NMOS, low voltage PMOS and low voltage NMOS transistor formation regions; and following removal of the patterned layer of masking material, conducting a second thermal oxidation to form second gate dielectric layers simultaneously over the channel regions of the high voltage NMOS, low voltage PMOS and low voltage NMOS transistor formation regions; the second gate dielectric layers being formed to a thickness less than the thickness to which the first gate dielectric layer is formed.

10. A method of manufacturing a semiconductor device, comprising:

forming a silicon oxide insulating film over high voltage PMOS, high voltage NMOS, low voltage PMOS and low voltage MOS transistor formation regions of a semiconductor substrate;

patterning the silicon oxide insulating film to form first element separation isolation structures for the high voltage PMOS and for the high voltage NMOS transistor formation regions;

forming and patterning a silicon nitride film as a mask layer to cover first channel regions of the high voltage NMOS, low voltage PMOS and low voltage NMOS transistor formation regions, leaving a second channel region of the high voltage PMOS transistor formation region exposed;

with the patterned silicon nitride film covering the first channel regions, conducting a first thermal oxidation to grow a first silicon oxide gate dielectric layer over the second channel region and to simultaneously form LOCOS second element separation isolation structures in the low voltage PMOS and low voltage NMOS transistor formation regions;

following the first thermal oxidation, removing the patterned silicon nitride film; and with the patterned silicon nitride film removed, conducting a second thermal oxidation to grow second silicon oxide gate dielectric layers simultaneously over the channel regions of the high voltage NMOS, low voltage PMOS and low voltage NMOS transistor formation regions; the second silicon oxide gate dielectric layers being formed to a thickness less than the thickness to which the first silicon oxide gate dielectric layer is formed.

11. The method of claim 10, further comprising forming a layer of polysilicon gate electrode material over the first and second silicon oxide gate dielectric layers.

12. The method of claim 11, further comprising patterning the layer of polysilicon gate electrode material to form gate electrodes; and implanting source/drain regions adjacent the gate electrodes.

13. The method of claim 12, further comprising implanting back gate regions adjacent source regions in the high voltage PMOS and high voltage NMOS transistor formation regions.

14. The method of claim 13, wherein the substrate comprises p-doped semiconductor material; and further comprising forming a n-type well in the high voltage PMOS transistor formation region; forming a p-type drain region in the n-type well; forming an n-type drain region in the high voltage NMOS transistor formation region; and forming an n-type well in the low voltage PMOS transistor formation region.

15. The method of claim 14, wherein forming the first element separation isolation structures includes forming first element separation isolation structures over a portion of the p-type drain region in the high voltage PMOS transistor formation region and over a portion of the n-type drain region in the high voltage NMOS transistor formation region.

16. The method of claim 15, wherein implanting the source/drain regions comprises implanting a drain region in another portion of the p-type drain region in the high voltage PMOS transistor formation region and implanting a drain region in another portion of the n-type drain region in the high voltage NMOS transistor formation region.

* * * * *